United States Patent [19]

Murayama et al.

[11] Patent Number: 4,759,030
[45] Date of Patent: Jul. 19, 1988

[54] SEMICONDUCTOR LASER

[75] Inventors: Yoshimasa Murayama, Tokyo; Yasutsugu Takeda, Saitama; Michiharu Nakamura, Tokyo; Yasuhiro Shiraki, Tokyo; Yoshifumi Katayama, Tokyo; Naoki Chinone, Tokyo, all of Japan

[73] Assignee: Hitachi, Ltd., Tokyo, Japan

[21] Appl. No.: 870,948

[22] Filed: Jun. 5, 1986

[30] Foreign Application Priority Data

Jun. 14, 1985 [JP] Japan .................. 60-128119

[51] Int. Cl.$^4$ .............................................. H01S 3/19
[52] U.S. Cl. ......................................... 372/96; 372/44; 372/45
[58] Field of Search ........................ 372/96, 45, 44

[56] References Cited

U.S. PATENT DOCUMENTS

| 4,365,260 | 12/1982 | Holonyak, Jr. | 357/17 |
| 4,665,528 | 5/1987 | Chinone et al. | 372/96 |
| 4,701,995 | 10/1987 | Dolan et al. | 372/96 |
| 4,704,720 | 11/1987 | Yamaguchi | 372/96 |

FOREIGN PATENT DOCUMENTS 0046712 12/1978 Japan .................................. 372/96

OTHER PUBLICATIONS

Fukuzawa et al; "Fabrication-Disordering"; Japanese Journal of Appl. Physics Supplements, Supplement, 15th Conference, pp. 58–59, Tokyo, Japan.
JEE Journal of Electronic Engineering, vol. 21, No. 213; 09/1984; p. 21; Tokyo, Japan; "Fujitsu Refines Method for Semiconductor Lasers".
Lang et al; "Electronic State–Semiconductor Superlattices"; Appl. Phys. Let., vol. 45, No. 1; 07/01/1984; pp. 98–100.
Okamoto; "Optical Properties–Laser Diode"; J. Vac. Sci. Technol., B3(2), Mar./Apr. 1985; pp. 687–693.
Arakawa et al; "Multidimensional-Threshold Current"; Appl. Phys. Lett. 40(11); 1 Jun. 1982; pp. 939–941.
Patent Abstracts of Japan, vol. 8, No. 268 (E-283), [1705], 7th Dec. 1984; JP-A-59-139691 (Nippon Denshin Denwa Kosha); 10-08-84.

Primary Examiner—James W. Davie
Assistant Examiner—Xuan T. Vo
Attorney, Agent, or Firm—Antonelli, Terry & Wands

[57] ABSTRACT

A semiconductor laser having high efficiency of luminescence can be obtained by forming a spatial fluctuation of potential so that the potential differs from position to position inside a plane perpendicular to a current flowing direction and electrons and holes or excitons formed by a combination of them can be localized not only in the current flowing direction but also inside the plane perpendicular to the current flowing direction. More definitely, corrugations or ruggedness having a mean pitch of below 100 nm and a level difference of from 1/10 to ½ of the mean thickness of an active layer are formed on the surface of the active layer of the semiconductor laser.

6 Claims, 3 Drawing Sheets

SEMICONDUCTOR LASER

BACKGROUND OF THE INVENTION

This invention relates to pin-type, SQW (Single Quantum Well) type and MQW (Multiple Quantum Well) type semiconductor lasers.

It has been known since the 1960's that a semiconductor laser can be made by utilizing the radiative recombination of electrons and holes at a p-n junction. However, it was only about a decade ago that CW lasing became possible in practice. At that time the necessity of having a specific structure for preventing holes and electrons injected from a p-n region from undergoing nonradiative recombination before radiative recombination has not been realized. Moreover, even if the concept was known, techniques for accomplishing such were inmature.

A new technique developed about 15 years ago is called the "double hetero structure". It involves a disposition of a potential barrier for preventing the electrons injected into a p region and the holes injected into an n region from separating a great distance from a junction depletion layer.

The injected electrons and holes must be recombined within a period as short as possible. Therefore, it is obviously most effective to increase the overlap of wave functions of the electrons and holes.

One method to achieve such overlap is to spatially localize the electrons and holes, or the excitons formed by a combination of them.

In conventional semiconductor lasers, a lightly doped layer or an undoped layer which is referred to as an "active layer" and is about 0.1 μm-thick plays a principal role in the recombination. FIG. 1 of the accompanying drawings conceptually shows an energy diagram of the conventional semiconductor lasers. Reference numeral 13 represents the active layer.

In the drawing, reference numeral 11 represents an n-type semiconductor layer; 12 is a barrier layer of an n-type semiconductor; 14 is a barrier layer of a p-type semiconductor; and 15 is a p-type semiconductor layer. The active layer 13 is interposed between the barrier layers 12 and 14 each having a greater band gap than the active layer 13. Reference numeral 10 represents the Fermi level, symbol c.b. represents the bottom of the conduction band and v.b. the top of the valence band. Symbols n, i and p represent n-type, intrinsic and p-type semiconductors, respectively.

In contrast, in SQW or MQW semiconductor lasers, one or a large number of hetero structures of GaAs and AlGaAs, for example, are superposed to form a potential well(s) and to reduce the freedom of an electron wave in a current flowing direction. In this manner a high recombination ratio is obtained by localizing the electrons, the holes and the excitons in at least one-dimensional direction. FIG. 2 shows the energy diagram of such a laser. This drawing conceptually shows the energy diagram in the same way as in FIG. 1. The portion that corresponds to 13 in FIG. 1 is MQW formed by alternately superposing AlGaAs 232 and GaAs 231. It is known theoretically that in the case of an exciton equivalent to a hydrogen atom, for example, the spread of a two-dimensional exciton is ½ of that of the wave function of the three-dimensional exciton.

In FIG. 2, reference numeral 20 represents the Fermi level, and 22 and 24 represent barrier layers of n-type and p-type, respectively.

In accordance with the heretofore known semiconductor laser technique, a high recombination ratio is obtained by forming SQW or MQW to reduce a threshold value and to obtain high efficiency. (Refer, for example, to "A Prospective in Superlattice Development", Physical Society of Japan, 1984, by Leo Esaki.) Nonetheless, sufficiently high efficiency cannot be obtained and semiconductor lasers having higher efficiency have therefore been desired.

SUMMARY OF THE INVENTION

One object of the present invention is to provide a semiconductor laser having a higher efficiency and a lower threshold current than conventional semiconductor lasers.

In order to accomplish the object described above, the semiconductor laser in accordance with the present invention localizes electrons and holes or excitons formed by a combination of them not only in the current flowing direction in the same way as in the prior art semiconductor lasers but also in a plane perpendicular to the current flowing direction. In order to localize the electrons, the holes and the excitons in the plane perpendicular to the current flowing direction as described above, the present invention forms a spatial fluctuation of potential so that potential differs from position to position inside the plane described above.

The semiconductor laser of the present invention obtains the spatial fluctuation of the potential by making an intentionally incomplete periodicity of the atomic arrangement of a crystal inside the plane perpendicular to the current flowing direction. More definitely, corrugations or ruggedness (hereinafter referred to as ruggedness) whose level difference is from 1/10 to ½ of the mean thickness of the active layer and which has a mean pitch, between projected portions, of up to 100 nm are disposed on the surface of the active layer. The lower limit of the mean pitch is about 10 nm from the restriction imposed on the processing technique, but it may be a smaller pitch, in principle. In other words, a theoretically perferred mean pitch of the ruggedness is about the spread of the wave function of the electron. In the case of GaAs, for example, the spread of the wave function is about 10 nm. Therefore, the mean pitch which has been believed considerably more effective than conventionally, though it may not be optimal, includes a range smaller than 10 nm. If the mean pitch of the ruggedness exceeds 100 nm, the effect of the present invention will be lost undesirably. If the level difference of the ruggedness is smaller than the range described above, the fluctuation of potential becomes small and the effect of the present invention becomes insufficient. If the level difference is greater than the range described above, on the other hand, the active layer tends to become discontinuous undesirably. In addition, in the semiconductor laser of the present invention, the lasing region is sufficiently thin to allow electrons and holes or excitons to be localized in a current flowing direction and the laser has at least one hetero junction, as in the prior art.

The semiconductor laser of the present invention having the construction described above remarkably improves the efficiency of luminescence and reduces the threshold current value.

DETAILED DESCRIPTION OF THE INVENTION

Figure 1:
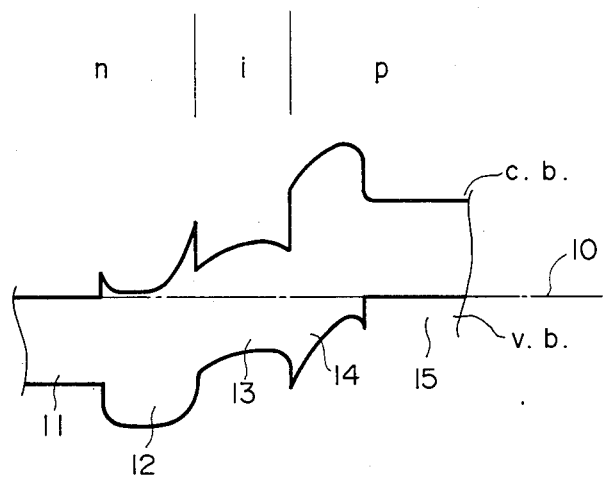
FIG. 1 is an energy diagram of a semiconductor laser having a conventional double hetero structure.
Figure 2:
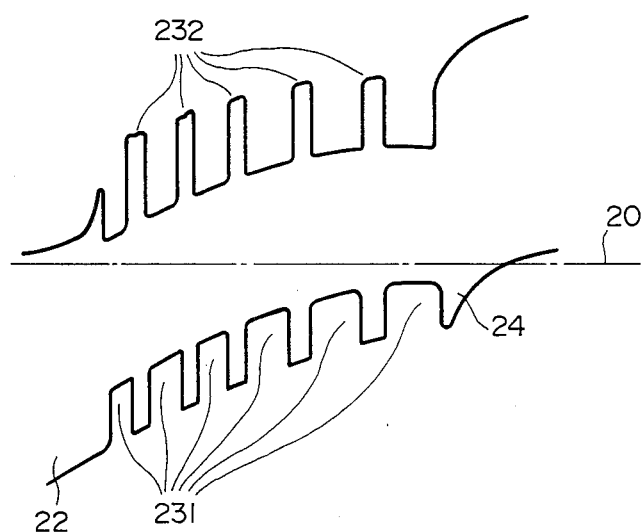
FIG. 2 is an energy diagram showing the structure of an active region of a conventional MQW semiconductor laser.

FIGS. 1 and 2 are energy diagrams of a semiconductor laser having a conventional double hetero structure and an active layer of a conventional MQW semiconductor laser as described above.

First of all, a phenomenon referred to as "Anderson localization" as the basis of the technical concept of the present invention will be described.

The most fundamental concept in solid state physics lies in that an electron wave forms a so-called "energy band" that spreads throughout a crystal due to the complete periodicity of the atomic arrangement in an ideally perfect crystal. Its band width will be hereby called "B".

In practical crystals in general, on the other hand, the energy band fluctuates spatially due to imperfections that develop for some reason or other. If the energy band of a given portion is different from that of the other portions from the aspect of energy, the order of the potential fluctuation will be hereby called "W". The case where W is sufficiently great and substantially satisfies the relation $W \geq B$ will now be considered. Since their energy bands are deviated from each other to an extent such that they do not overlap with one another, it will be self-explanatory that the electrons existing in one portion cannot assume the state where they can spread to other portions. Localizing an electron resulting from the spatial fluctuation of the potential of the electron is called "Anderson localization" as it is named after Anderson, the researcher who proposed such a concept for the first time. It is also known that the condition is too severe. In practical semiconductors, only a limited state at the bottom of the band is occupied by the electron. Under the condition of about $W \geq B/100$, for example, the states near the bottom of the band are localized.

Even after the localization in one-dimensional direction due to the potential well in the current flowing direction described already, the electrons, the holes and the excitons are not generally localized in the remaining two-dimensional direction. In such a system, the electrons, the holes and the excitons sufficiently spread inside the plane perpendicular to the current flowing direction and form a state which is referred to as "two-dimensional electron gas (2DEG)".

The present invention provides a novel method of limiting the freedom in this plane in order to localize the electrons, the holes and the excitons in this plane. By so doing, the present invention reduces the spread of the wave functions of the electrons and the holes to increase their overlap, or limits the two-dimensional freedom of, and localizes, the excitons which are formed by the electrons and the holes and are equivalent to hydrogen atoms to obtain smaller excitons, and reduces the life of these excitons in order to improve the efficiency of luminescence.

The above explains the effect of localization inside the two-dimensional plane as the active region of the semiconductor laser, but the following effects can also be expected. Ordinarily, a semiconductor laser is scribed into devices at the final stage of its production process. At this time, passivation must be applied to the scribed surface by suitable means. Such passivation is helpful for preventing the degradation after the passage of a long period of time and for improving the efficiency. The scribed surface ordinarily functions as a nonradiative recombination center. It is therefore preferred that the injected electrons and holes exist while avoiding the scribed surface. It can be understood easily that in order to accomplish such an object, the electrons and the holes must be localized more deeply within the device.

It is possible to employ the following methods as the method of forming the spatial fluctuation of the potential as the primary subject matter of the present invention.

Namely, predetermined patterning is first made by using any one of the photolithography processes using chemical etching, ion-beam etching or plasma etching, the direct ion-beam etching method and the selective growth method by photo-CVD (photo-chemical vapor deposition method).

Alternatively, growth involving ruggedness of at least two atomic layers may be effected by an MBE method (Molecular Beam Epitaxy method).

Although the embodiments of the present invention illustrate examples of a GaAs-AlGaAs system laser and an InP-InGaAsP system laser, the present invention can of course be applied to semiconductor lasers using other semiconductor materials as is obvious from the principle of the invention.

Definite methods of forming the ruggedness will be described in further detail in the following embodiments.

DESCRIPTION OF THE PREFERRED EMBODIMENTS

Embodiment 1

Figure 3:
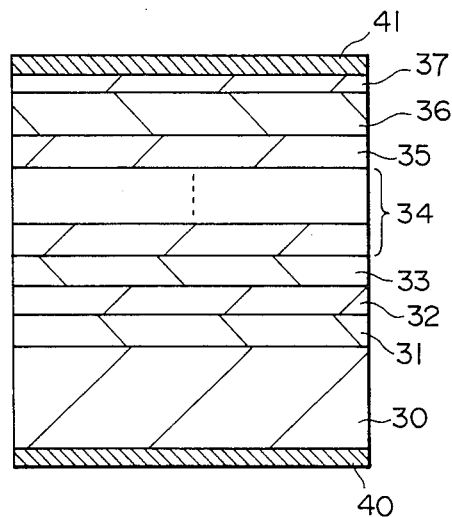
FIG. 3 is a sectional view of a semiconductor laser in accordance with one embodiment of the present invention.
Figure 4:
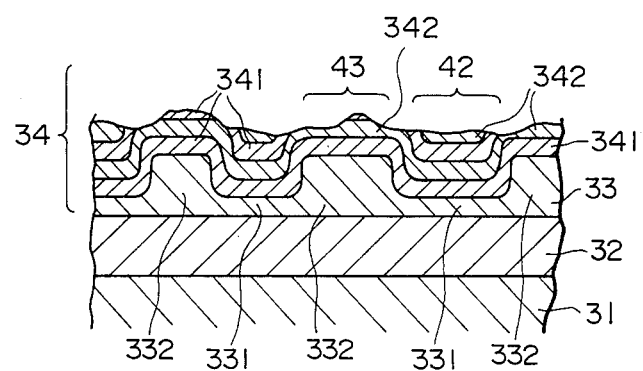
FIG. 4 is a partial sectional view of the portion near the active layer of the semiconductor laser shown in FIG. 3.

FIG. 3 is a sectional view showing the semiconductor laser in accordance with this embodiment and FIG. 4 is a partial sectional view showing in detail the portions near its active layer.

A p-type $Al_{0.45}Ga_{0.55}As$ layer 31 doped with Be to a high concentration of at least $1 \times 10^{17} cm^{-3}$ is grown by use of a molecular beam epitaxy apparatus to a thickness of 10 nm on a p-type GaAs substrate 30 doped with Zn to a concentration of about $1 \times 10^{17} cm^{-1}$. Next, an undoped GaAs layer 32 is grown in a thickness of 10 nm within about 10 minutes as an active layer, but at the final stage of this growth, the temperature of a K-cell (Knudsen cell) for evaporating As is set to a temperature which is about 10° C. lower than the optimal temperature for the growth on a mirror surface for one minute. Generally, the total thickness of the active layer is from 60 to 100 nm. Next, the temperature of the K- cell for As is reduced, and an undoped AlGaAs layer 33 is grown in the As-deficient atmosphere, whereby the AlGaAs layer 33 grows in the island-like form as shown in FIG. 4. After the temperature is again returned to the optimal temperature, ten layers of undoped GaAs and undoped $Al_{0.2}Ga_{0.8}As$ each of which is 3 nm-thick are alternately grown. (These regions are represented by 34 in FIGS. 3 and 4 with the GaAs layer 341 and the AlGaAs layer 342 forming together the region 34.)

Figure 5:
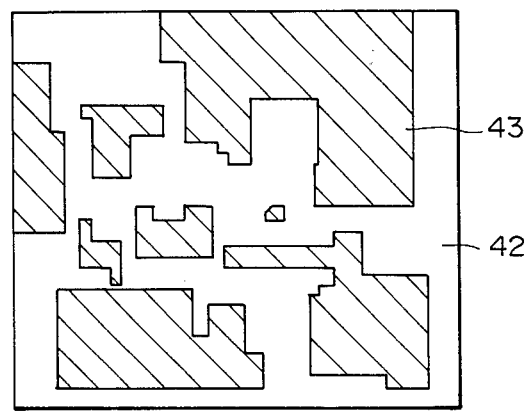
FIG. 5 is a plan view useful for explaining the active region of the semiconductor laser shown in FIG. 3.

FIG. 5 is a schematic horizontal sectional view of the active layer shown in FIGS. 3 and 4, and it schematically illustrates the very small planar structure of the active layer 34 formed in the manner described above. In this case, it is customary to call the GaAs layer the "well layer" and the AlGaAs layer, the "barrier layer". The AlGaAs 332 is 10 nm-thick at the island-like portion 43 which is grown in the projected form, and the AlGaAs 331 at the other portions 42 is about 3 nm-thick. The island-like growth does not continue in the second layer or further layers, because the growth is effected at the optimal temperature. However, the first ruggedness is passed to the second layer and further layers, but the ruggedness is gradually reduced and made flat. In FIG. 5, there are illustrated a horizontally viewed pattern and the distribution of the recessed portion 42 and the projected portion 43. The projected portions 43 becomes a thin active layer as a whole while the recessed portions 42 become a thick active layer as a whole. The difference of their thickness is about 7 nm, and since the projected portion has a higher energy than the recessed portion, the electrons, the holes and the excitons are localized in the recessed portion.

Thereafter, an about 1 $\mu$m-thick n-$Al_{0.45}Ga_{0.55}As$ layer 35 whose band gap is greater than that of the barrier layer described above and which has a conductivity type opposite to that of the substrate and n-$Ga_{1-w}Al_wAs$ (w=0.45~0.6) cap layer 36 of about 0.3 $\mu$m thickness are grown on the multi-layered region 34, in the same way as the conventional GaAs type semiconductor lasers. After an n-GaAs layer 37 is formed in a thickness of 0.1 $\mu$m on the cap layer, an n-electrode (Au-Ge-Ni-Au) 41 and a p-electrode (Cr-Au) 40 are formed on the surface of the n-type GaAs 37 and the lower surface of the p-type GaAs substrate 30, respectively. Finally, a semiconductor laser having a resonator length of 300 $\mu$m is produced through a heretofore known cleavage process.

The semiconductor laser thus produced improves the efficiency by about 20% in comparison with conventional semiconductor lasers.

Embodiment 2

After an about 5 $\mu$m-thick buffer layer consisting of p-type InP is formed by heretofore known epitaxy on a p-type InP substrate, a semiconductor laser having an active region consisting of SQW of InGaAsP-InAsP is produced by OMVPE (Organo-metallic Vapor Phase Epitaxy) using TMI (trimethyl-indium), TMG (Trimethyl-gallium), $PH_3$ and $AsH_3$ as the sources. In this case, two InGaAsP layers which are about 100 nm thick serve as the barrier layer, and an InAsP layer as a well layer is interposed between these layers. When about 10 nm-thick InAsP is grown, an interference pattern of an Ar laser is radiated onto the surface of the substrate from outside of the reactor and the thickness changes to a fringe-like form.

Figure 6:
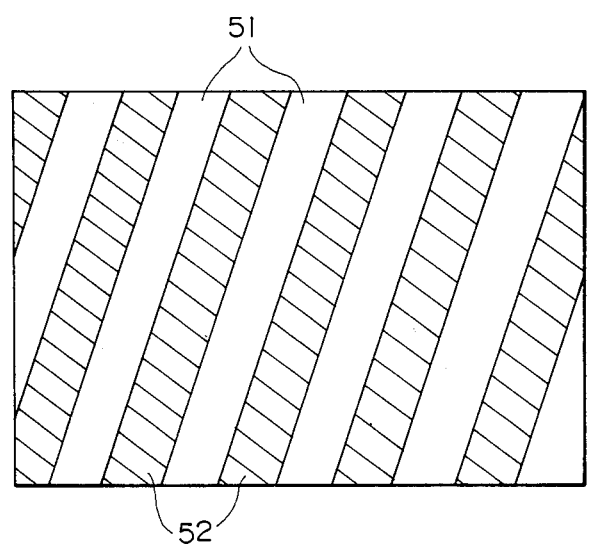
FIG. 6 is a plan view useful for explaining the active region of the semiconductor laser in accordance with another embodiment of the present invention

A Mach-Zehnder interferometer is used for forming the interference pattern. The pitch of the fringe is 100 nm and the level difference of the ruggedness is 2 to 3 nm. When two argon lasers are radiated in such a manner that their interference fringes cross at right angles to each other, the thickness changes in a checkered pattern. The formation of the fringe-like ruggedness is an application of the opto-CVD method. The change of thickness of the active layer inside the plane also causes the fluctuation of the potential and hence, localization of the electrons, the holes and the excitions inside the plane. FIG. 6 is a plan view schematically illustrating the active layer in this embodiment. Reference numeral 51 represents a region in which fringe-like growth occurs excessively, and reference numeral 52 represents a region in which fringe-like growth is not sufficient.

The change of thickness can be obtained similarly by photo etching after the growth. However, since ion beam etching will introduce defects into the active layer which is the most important portion of the laser, careful attention must be paid to a subsequent annealing process. From this aspect, chemical etching is more advantageous. Hardly any improvement can be observed in the efficiency of luminescence by ion beam etching, and this is believed to result from the technical limit of the current photolithography technique using the ion beam. When a process is conducted to obtain the fringe-like form, the effect of localization is not very great if its width is as great as about 0.1 $\mu$m. Since the wave function of the electron is about 10 nm in the case of GaAs, the change of potential must be kept at substantially the same level.

Though the above illustrates a photo etching method, it is also possible to effect etching without using a photo resist by directly scanning the substrate surface while electrically controlling an ion beam. In such a case, it is preferably to form a random pattern in which the electron can be localized most easily.

The semiconductor laser of this embodiment has substantially the same structure as ordinary InP-InGaAsP system semiconductor lasers except that SQW of InGaAsP-InAsP is used for the active region, and in addition, the ruggedness are formed in order to cause the fluctuation of potential on the plane of the thickness of the active layer.

In accordance with the method described above, an improvement of about 10% can be observed in the current threshold value over that of conventional semiconductor lasers.

As described in the foregoing, the present invention can provide the improvement of 10 to 30% in the efficiency of luminescence and the current threshold value when compared with those conventionl semiconductor lasers.

What is claimed is:

1. In a semiconductor laser including a first conductivity type semiconductor layer, a barrier layer of first conductivity type, a lasing region, a barrier layer of second conductivity type and a second conductivity type semiconductor layer laminated in that order, wherein the lasing region is sufficiently thin to allow electrons and holes or excitons formed by said electrons and said holes to be localized in a current flowing direction and which has at least one hetero junction, the improvement wherein a spatial fluctuation of potential is formed to a magnitude such that said electrons and said holes or said excitons can be localized inside a plane perpendicular to said current flowing direction by forming ruggedness on the surface of an active layer, the ruggedness having a mean pitch of below 100 nm and a level difference of from 1/10 to ½ of a mean thickness of the active layer.

2. A semiconductor laser according to claim 1 wherein a quantum well structure is formed in said current flowing direction and is used as said lasing region.

3. A semiconductor laser according to claim 2 wherein said quantum well structure is a single quantum well.

4. A semiconductor laser according to claim 2 wherein said quantum well structure is multiple quantum wells.

5. A semiconductor laser according to claim 1 wherein said mean pitch is from 10 to 100 nm.

6. A semiconductor laser comprising:
a semiconductor substrate;
a first semiconductor layer formed on said substrate;
an active layer formed on said first semiconductor layer including:
   a first undoped semiconductor layer having a first semiconductor composition,
   a second undoped semiconductor layer having a second semiconductor composition, and
   an undoped composition layer made up of alternating layers of said first and second semiconductor compositions;
a second semiconductor layer formed on said active layer;
a cap layer formed on said second semiconductor layer;
a third semiconductor layer formed on said cap layer; and
electrodes formed on said third semiconductor layer and said substrate opposite said first semiconductor layer,
wherein the active layer has a rugged surface having a means pitch of from 10 to 100 nm and a level difference of from 1/10 to ½ the mean thickness of said active layer.

* * * * *